(12) United States Patent
Watsuda et al.

(10) Patent No.: US 11,798,880 B2
(45) Date of Patent: Oct. 24, 2023

(54) ELECTRONIC DEVICE AND METHOD OF FABRICATING AN ELECTRONIC DEVICE

(71) Applicant: Innolux Corporation, Miao-Li County (TW)

(72) Inventors: Hirofumi Watsuda, Miao-Li County (TW); Shu-Ming Kuo, Miao-Li County (TW); Chun-Hsien Lin, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 96 days.

(21) Appl. No.: 17/486,868

(22) Filed: Sep. 27, 2021

(65) Prior Publication Data
US 2023/0102061 A1    Mar. 30, 2023

(51) Int. Cl.
*H01L 23/525* (2006.01)
*H01L 21/768* (2006.01)
*H01L 33/62* (2010.01)

(52) U.S. Cl.
CPC ...... *H01L 23/525* (2013.01); *H01L 21/76892* (2013.01); *H01L 21/76895* (2013.01); *H01L 33/62* (2013.01)

(58) Field of Classification Search
CPC ... H01L 22/32; H01L 22/22; H01L 21/76895; H01L 23/525; H01L 23/5252; H01L 23/5254; H01L 23/5256; H01L 23/5258; H01L 21/485; H01L 21/76894; H01L 21/76892; H01L 33/62; G02F 1/1309; G02F 2201/506; G02F 2201/508
See application file for complete search history.

(56) References Cited

U.S. PATENT DOCUMENTS

2019/0157340 A1   5/2019   Liao et al.
2023/0197735 A1*  6/2023   Wang .................. H01L 22/22
                                                        257/89

FOREIGN PATENT DOCUMENTS

TW       200924229       6/2009

\* cited by examiner

*Primary Examiner* — Thanhha S Pham
(74) *Attorney, Agent, or Firm* — JCIPRNET

(57) ABSTRACT

An electronic device and method of fabricating the same are provided herein. The electronic device includes a first main pad; a second main pad; a first repair line electrically connected to the first main pad; a second repair line electrically connected to the second main pad, wherein the first repair line and the second repair line forms a first weldable region; a first spare pad; a second spare pad; a connection line electrically connected to the second repair line, the first spare pad and the second spare pad; and a first electronic unit disposed on the first main pad and the second main pad.

20 Claims, 9 Drawing Sheets

ELECTRONIC DEVICE AND METHOD OF FABRICATING AN ELECTRONIC DEVICE

BACKGROUND

Technical Field

The disclosure is related to an electronic device and a method of fabricating an electronic device.

Description of Related Art

Electronic devices, for example light emitting devices, using electronic units (for example light emitting diodes, LEDs) as the light emitting units have been applied in various fields, such as the display field, the illumination field etc. Usually, the electronic units are fabricated in a chip/die form and bonded to the bonding pads of a driving circuit of the electronic device. Once the bonded electronic units are failed or the boding connection between the bonding pads and the electronic units has defect, the manufacturer will need more time to repair defects.

SUMMARY

The disclosure is directed to an electronic device having a repair structure for repairing a defect.

The disclosure is directed to a method of fabricating an electronic device capable of repairing a defect to achieve a desirable yield rate.

In accordance with some embodiments, an electronic device includes a first main pad; a second main pad; a first repair line electrically connected to the first main pad; a second repair line electrically connected to the second main pad, wherein the first repair line and the second repair line forms a first weldable region; a first spare pad; a second spare pad; a connection line electrically connected to the second repair line, the first spare pad and the second spare pad; and a first electronic unit disposed on the first main pad and the second main pad.

In accordance with some embodiments, a method of fabricating an electronic device includes providing a substrate; forming a wiring structure on the substrate, the wiring structure comprising a first repair line, a second repair line and a connection line, wherein the first repair line and the second repair line construct a first weldable region; forming a bonding layer on the wiring structure, the bonding layer comprising a first main pad, a second main pad, a first spare pad, and a second spare pad, wherein the first repair line is electrically connected to the first main pad, the second repair line is electrically connected to the second main pad, the connection line is electrically connected to the second repair line, the first spare pad and the second spare pad; and placing a first electronic unit on the first main pad and the second main pad.

In view of the above, the electronic device of the embodiments in the disclosure is repairable and thus has a desired yield rate.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
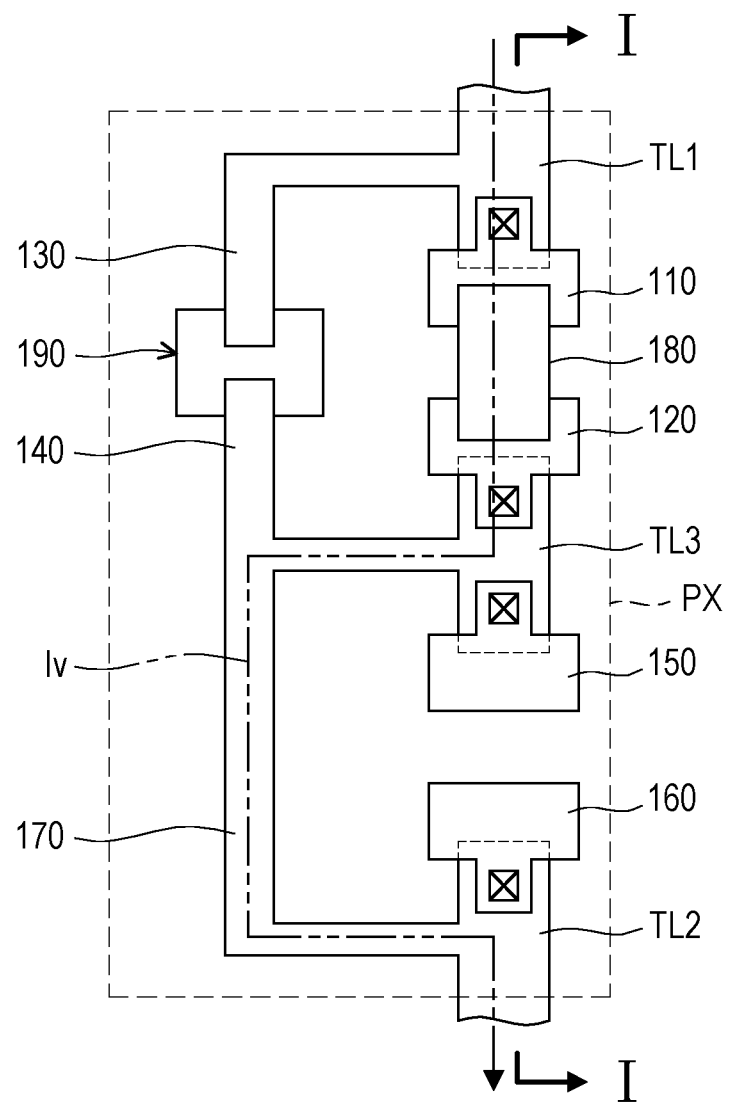
FIG. 1 schematically illustrates a portion of an electronic device in accordance with some embodiments of the disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

Electrical connection as described in the disclosure may refer to direct connection or indirect connection. In the case of direct connection, the terminal points of two components on the circuit are directly connected or are connected to each other via a conductor line segment. In the case of indirect connection, a switch, a diode, a capacitor, an inductor, a resistor, another suitable component, or a combination of the above components is present between the terminal points of two components on the circuit. However, the disclosure is not limited thereto.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

In a disclosure, adjacent circuit units may share the same parts or wires and may also include its specific parts therein. In addition, any value disclosed herein may imply a certain range around the disclosed value; for example, if a first value is equal to a second value, it is implied that there may be an error of about 10% between the first value and the second value.

It should be noted that the technical features in different embodiments described in the following can be replaced, recombined, or mixed with one another to constitute another embodiment without departing from the spirit of a disclosure.

In the present disclosure, the electronic device may optionally include a display function, a sensing function, a touch sensing function, an antenna function, other suitable function or a combination thereof, but not limited thereto. In some embodiments, the electronic device may include a tiled device, but not limited thereto. The electronic device may include liquid crystal (LC) molecules, an organic light-emitting diode (OLED), an inorganic light-emitting diode (LED) such as a micro-LED and/or a mini-LED, quantum dots (QDs) material, a quantum-dot light-emitting diode (QLED, QDLED), fluorescence material, phosphor material, other suitable material or a combination thereof, but not limited thereto. Moreover, the electronic device may include a color light emitting device or a monochrome light emitting device, and a shape of the electronic device may be a rectangle, a circle, a polygon, a shape having a curved edge or other suitable shape, but not limited thereto. In the following, in order to explain exemplarily, the electronic device is a light emitting device having electronic units as an example, but the electronic device is not limited thereto. In some embodiments, the electronic device may include a liquid crystal panel or be other suitable electronic units. The electronic units can include passive components and active components, such as capacitors, resistors, inductors, diodes, and transistors. The diodes may include a light emitting diode or a photodiode. The light emitting diode may include, for example, an organic light emitting diode (OLED), a mini light emitting diode (mini LED), a micro light emitting diode (micro LED) or a quantum dot light emitting diode (quantum dot LED), but not limited to this.

FIG. 1 schematically illustrates a portion of an electronic device in accordance with some embodiments of the disclosure. In FIG. 1, an electronic device 100 includes a first main pad 110, a second main pad 120, a first repair line 130, a second repair line 140, a first spare pad 150, a second spare pad 160, a connection line 170 and a first electronic unit 180. The first main pad 110 and the second main pad 120 are located side by side and spaced from each other. The first repair line 130 is electrically connected to the first main pad 110 and the second repair line 140 is electrically connected to the second main pad 120. The first spare pad 150 and the second spare pad 160 are located side by side and spaced from each other. The connection line 170 is electrically connected to the second repair line 140, the first spare pad 150 and the second spare pad 160. The first electronic unit 180 is disposed on the first main pad 110 and the second main pad 120 and electrically connected to the first main pad 110 and the second main pad 120.

In addition, the first repair line 130 and the second repair line 140 form a first weldable region 190. In some embodiments, the first repair line 130 and the second repair line 140 are physically and electrically disconnected to each other in an initial situation and can be electrically connected to each other in a repaired situation through a welding process performed at the first weldable region 190. Specifically, the first weldable region 190 in the disclosure represents a region where a welding process is able to be performed to establish an electric transmission path between the first repair line 130 and the second repair line 140.

The first electronic unit 180 can be an LED that is fabricated in a chip/die form and bonded to the first main pad 110 and the second main pad 120. For example, the first electronic unit 180 can have two terminals, such as a cathode and an anode, and the two terminals are connected to the first main pad 110 and the second main pad 120 respectively. The first electronic unit 180 can be a flip-chip type LED, a lateral type LED, a vertical type LED or the like, but not limited thereto. The first electronic unit 180 can be bonded to the first main pad 110 and the second main pad 120 through a flip-chip bonding, a wire-bonding or the like.

In some embodiments, the first main pad 110, the second main pad 120, the first repair line 130, the second repair line 140, the first spare pad 150, the second spare pad 160, the connection line 170 and the first electronic unit 180 can be disposed in a light emitting pixel PX and the electronic device 100 can include multiple light emitting pixels PX based on various requirements. For example, the multiple light emitting pixels PX can be independently controlled to present different levels of brightness and the electronic device 100 can be applied in the display field, but the disclosure is not limited thereto. In addition, the electronic device 100 can further include a first transmission line TL1, a second transmission line TL2 and a third transmission line TL3 for establishing the required electric transmission path. The first transmission line TL1 electrically connects the light emitting pixel PX to a first voltage source (not shown) and the second transmission line TL2 electrically connects the light emitting pixel PX to a second voltage source (not shown). The third transmission line TL3 is electrically connected between the second main pad 120 and the first spare pad 150, and the second main pad 120, the first spare pad 150 and the second spare pad 160 can be connected in series. One of the first voltage source and the second voltage source can apply a voltage, for example a driving voltage (Vdd), and the other of the first voltage source and the second voltage source can apply another voltage, for example a common voltage (Vss) or a ground voltage. Upon the application of the driving voltage and the common/ground voltage, a driving current can pass through the light emitting pixel PX to drive the first electronic unit 180 and emit a light.

Specifically, the first transmission line TL1 is connected to the first main pad 110 and the second transmission line TL2 is connected to the second spare pad 160 and the connection line 170. Therefore, the voltage on the first transmission line TL1 can be applied to the first main pad 110 and the voltage on the second transmission line TL2 can be applied to the second main pad 120 through the connection line 170. In the initial situation, the first repair line 130 is electrically disconnected to the second repair line 140 and the first spare pad 150 is spaced from the second spare pad 160, and the voltage on the first transmission line TL1 would not be applied to the second repair line 140, the first spare pad 150, the second spare pad 160 and the connection line 170. Similarly, the voltage on the second transmission line TL2 would not be applied to the first repair line 130 as well as the first main pad 110.

In the case that the first electronic unit 180 is an acceptable part that can function normally, the electrical transmission path of a driving current Iv would be established from the first transmission line TL1 to the second transmission line TL2 through the first main pad 110, the first electronic unit 180, the second main pad 120, and the connection line 170 in sequence. Therefore, the driving current Iv can pass through the first electronic unit 180 between the first main pad 110 and the second main pad 120 to drive the first electronic unit 180 to emit light. As such, the light emitting pixel PX can provide light emitting function normally. In the embodiments, the first spare pad 150 and the second spare pad 160 are dummy and no electronic unit is disposed on the first spare pad 150 and the second spare pad 160. In the disclosure, the dot-dash line indicating the driving current Iv is used for presenting the transmission path of the driving current Iv, but the transmission direction of the driving current Iv is not limited. In some embodiments, the transmission direction of the driving current Iv can be opposite to the arrow shown in the drawings.

Figure 2:
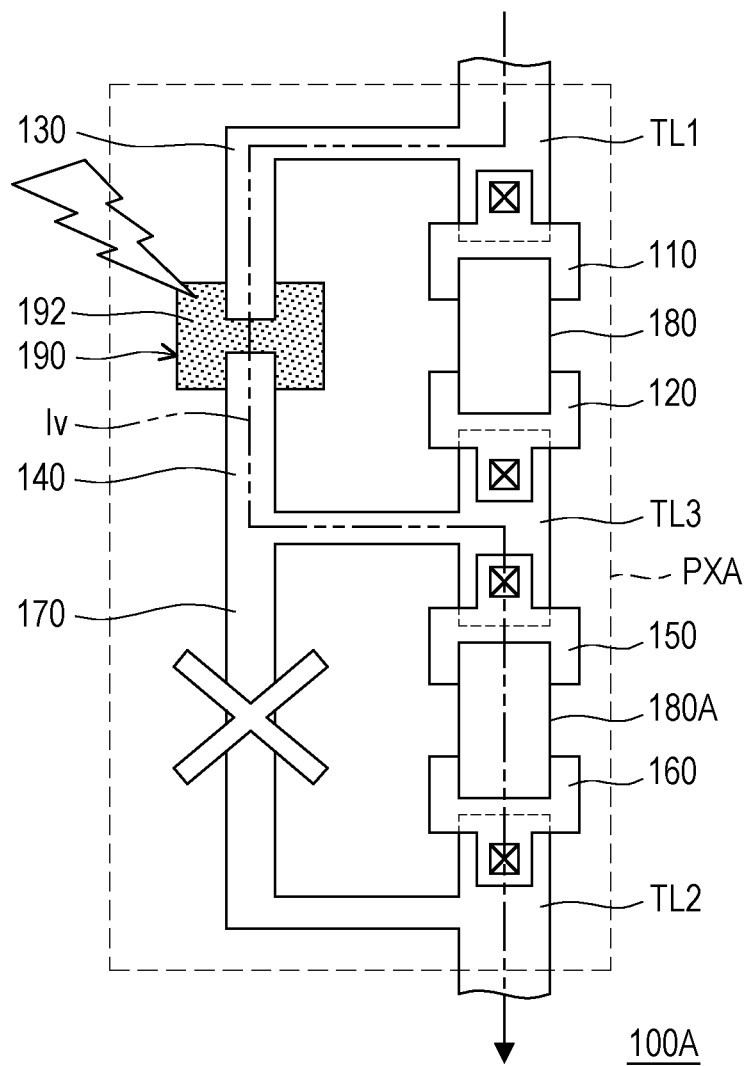
FIG. 2 schematically illustrates a portion of an electronic device in accordance with some embodiments of the disclosure.

FIG. 2 schematically illustrates a portion of an electronic device in accordance with some embodiments of the disclosure. The electronic device 100A of FIG. 2 is similar to the electronic device 100 of FIG. 1 and the same reference numbers in the two embodiments represent the same components. In other words, the descriptions for the components in the embodiment of FIG. 1 can be incorporated in the embodiment of FIG. 2. The difference between the FIG. 1 and the FIG. 2 is that FIG. 2 further includes a spare electronic unit 180A. The first main pad 110, the second main pad 120, the first repair line 130, the second repair line 140, the first spare pad 150, the second spare pad 160, the connection line 170, the first electronic unit 180, and the spare electronic unit 180A can serve as a light emitting pixel PXA. The light emitting pixel PXA of the electronic device 100A can be obtained by repairing the light emitting pixel PX in the case that the first electronic unit 180 has a defect.

For example, in the case that the first electronic unit 180 in the electronic device 100 is found to have an open circuit defect, the electronic device 100 can be repaired to obtain the electronic device 100A. Specifically, the electronic device 100A is fabricated by providing the electronic device 100 and preforming a repair process. The repair process can include placing the spare electronic unit 180A on the first spare pad 150 and the second spare pad 160, cutting the connection line 170, and welding a first weldable region 190 defined between the first repair line 130 and the second repair line 140. The first weldable region 190 is welded to form a welded structure 192 that electrically connects the first repair line 130 and the second repair line 140. Through welding the first weldable region 190 to form the welded structure 192 and cutting the connection line 170, an electrical transmission path between the first transmission line TL1 and the first spare pad 150 is established through the first repair line 130, the welded structure 192, and the second repair line 140 without passing through the connection line 170 to the second spare pad 160 since the connection line 170 is cut as an open circuit. Therefore, the driving current Iv can pass through the spare electronic unit 180A to drive the spare electronic unit 180A and emit a light.

In some alternative embodiments, the first electronic unit 180 in the electronic device 100 has a short circuit defect and the first main pad 110 is in direct electrically connected to the second main pad 120 through the first electronic unit 180. The electronic g device 100 can be repaired to obtain the electronic device 100A by placing the spare electronic unit 180A on the first spare pad 150 and the second spare pad 160 and cutting the connection line 170, and the first spare pad 150 is not in direct electrically connected to the second spare pad 160 and the driving current Iv can pass through the spare electronic unit 180A to drive the spare electronic unit 180A and emit a light. In the case that the first electronic unit 180 has a short circuit defect, a continuous electric transmission path can be established from the first transmission line TL1 to the first spare pad 150 through the first main pad 110, the first electronic unit 180, the second main pad 120 and the third transmission line TL3, and the welding of the first weldable region 190 can be selectively omitted.

In brief, the repaired structure of the light emitting pixel PXA can include the disposition of the spare electronic unit 180A and the disconnection/cut of the connection line 170 when a short circuit defect of the first electronic unit 180 occurs or include the disposition of the spare electronic unit 180A, the disconnection/cut of the connection line 170, and the electrical connected between the first repair line 130 and the second repair line 140 when an open circuit defect of the first electronic unit 180 or a short circuit defect of the first electronic unit 180 occurs. Therefore, various repair process can be adopted to electrically connect the first spare pad 150 and the first transmission line TL1 and render the first spare pad 150 electrically independent from the second spare pad 160.

In the electronic device 100, the driving current Iv passes from the first transmission line TL1 to the second transmission line TL2 through the first main pad 110, the first electronic unit 180, the second main pad 120, and the connection line 170 in sequence, and the first electronic unit 180 emits light. In the electronic device 100A having the welded structure 192, the driving current Iv passes from the first transmission line TL1 to the second transmission line TL2 through the first repair line 130, the welded structure 192, the second repair line 140, the first spare pad 150, the spare electronic unit 180A and the second spare pad 160 in sequence, and the spare electronic unit 180A emits light. In other words, the electronic device 100 and the electronic device 100A both achieves an equivalent function of the circuit.

Figure 3:
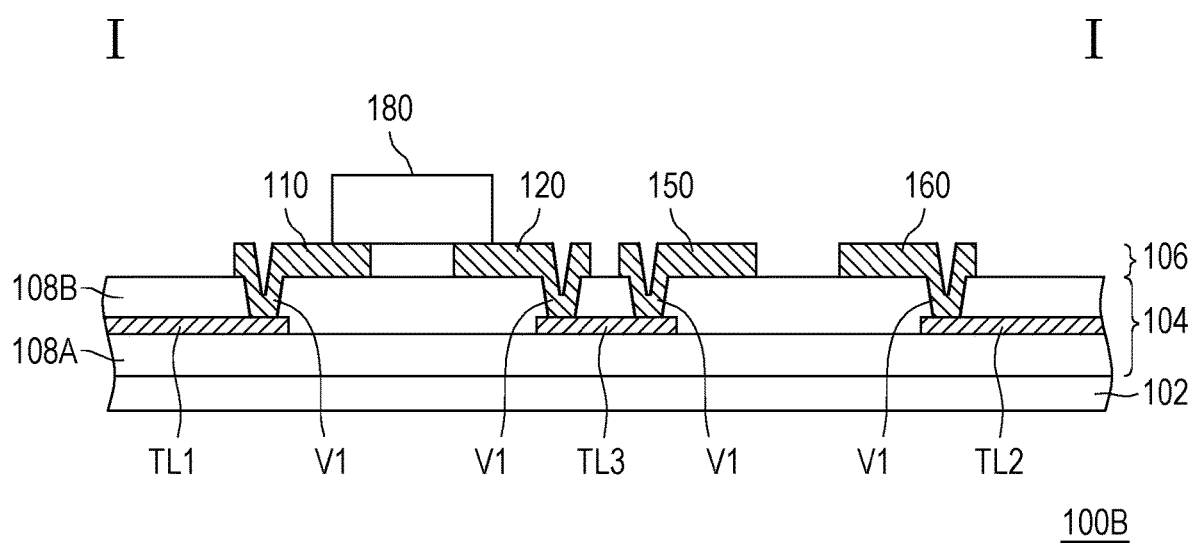
FIG. 3 schematically illustrates a cross section of an electronic device in accordance with some embodiments of the disclosure.

FIG. 3 schematically illustrates a cross section of an electronic device in accordance with some embodiments, and the cross section shown in FIG. 3 is corresponding to the line I-I in FIG. 1. In FIG. 3, the electronic device 100B includes a substrate 102, a wiring structure 104, a bonding layer 106, and a first electronic unit 180. The wiring structure 104 can include one or more conductive layers that are patterned to define the wiring layout. For example, the conductive layers constructing the wiring structure 104 can be patterned to define at least the first repair line 130, the second repair line 140, the connection line 170, the first transmission line TL1, the second transmission line TL2 and the third transmission line TL3 in FIG. 1. The bonding layer 106 can be formed by another conductive layer and the surface of the bonding layer 106 is at least partially exposed so that the first electronic unit 180 can be bonded to the bonding layer 106. The bonding layer 106 can be patterned to define the first main pad 110, the second main pad 120, the first spare pad 150 and the second spare pad 160. As shown in FIG. 3, the first electronic unit 180 can be bonded to the first main pad 110 and the second main pad 120 and the spare electronic unit 180A described in FIG. 2 can be bonded to the first spare pad 150 and the second spare pad 160.

In the embodiment, one or more insulation layer, for example an insulation layer 108A and an insulation layer 108B can be disposed on the substrate 102 to separate different conductive layers to achieve the required electric transmission path. The quantity of the insulation layers 108A and 108B and that of the conductive layer can be determined based on various designs and not limited to a specific number. The bonding layer 106 can be electrically connected to a corresponding component of the wiring structure 104 through a respective conductive via V1 and the conductive via V1 can pass through at least one insulation layer such as the insulation layer 108B to electrically connect to the conductive layer of the wiring structure 104.

A method of fabricating the electronic device 100B includes at least providing the substrate 102, forming the wiring structure 104 on the substrate 102, forming the bonding layer 106 on the wiring structure 104 and placing the first electronic unit 180 on the first main pad 110 and the second main pad 120 of the bonding layer 106. Similar to the embodiment of FIG. 1, the first repair line 130 is electrically connected to the first main pad 110, the second repair line 140 is electrically connected to the second main pad 120, the connection line 170 is electrically connected to the second repair line 140, the first spare pad 150 and the second spare pad 160. In addition, though FIG. 3 does not show the first weldable region 190 in FIG. 1, the first repair line 130 and the second repair line 140 in FIG. 1 can construct the first weldable region 190.

In some embodiments, the bonding layer 106 can be omitted. And, the first main pad 110, the second main pad 120, the first spare pad 150, and the second spare pad 160 can be formed by patterning the conductive layer of the wiring structure 104.

Figure 4:
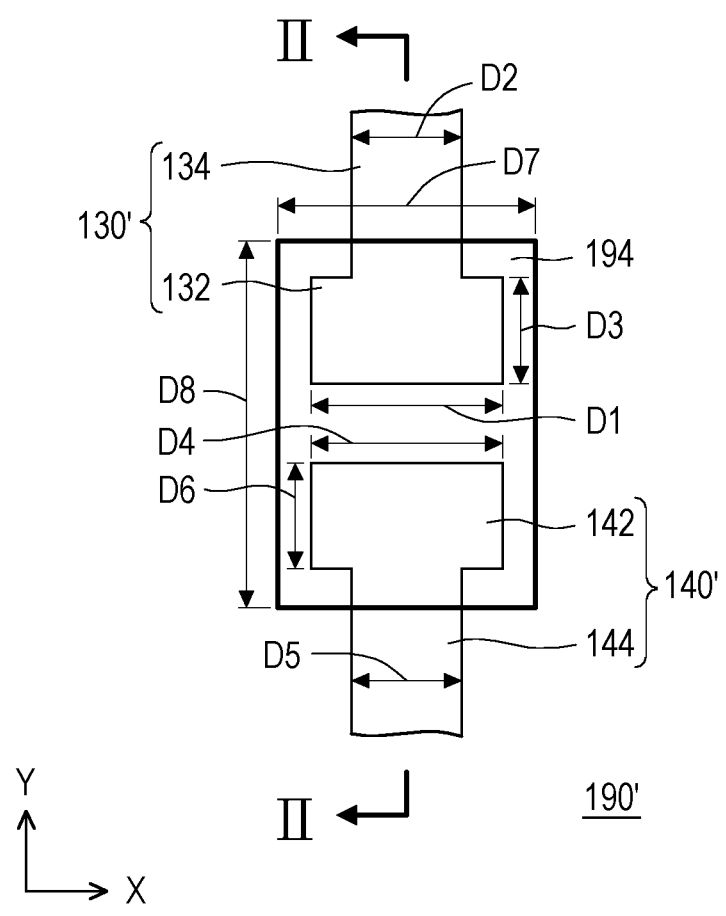
FIG. 4 schematically illustrates a weldable region in accordance with some embodiments of the disclosure.

FIG. 4 schematically illustrates a weldable region in accordance with some embodiments of the disclosure. A weldable region 190' shown in FIG. 4 is formed by the first repair line 130' and the second repair line 140'. Specifically, the first repair line 130' includes a terminal portion 132 and a wiring portion 134 which may be narrower than the terminal portion 132 when measured in X direction. In other words, a width of the terminal portion 132 may be greater than a width of the wiring portion 134, but the disclosure is not limited thereto. The second repair line 140' includes a terminal portion 142 and a wiring portion 144 which may be narrowed than the terminal portion 142 when measured in X direction. In other words, a width of the terminal portion 142 may be greater than a width of the wiring portion 144, but the disclosure is not limited thereto. The wiring portion 134 and the wiring portion 144 are extended in Y direction, but the disclosure is not limited thereto. The terminal portion 132 is more adjacent to the terminal portion 142 than the wiring portion 134 and the terminal portion 142 is more adjacent to the terminal portion 132 than the wiring portion 144. Therefore, the first repair line 130' and the second repair line 140' are arranged in a manner that the terminal portion 132 faces the terminal portion 142. The structure of the weldable region 190' can be applicable to the embodiment of FIG. 1 to serve as an implemental example of the first weldable region 190.

In the embodiment, a repair pad 194 is disposed in the weldable region 190'. The repair pad 194 can be formed of a conductive layer that is different from at least one of the first repair line 130' and the second repair line 140'. The repair pad 194 can overlap both the first repair line 130' and the second repair line 140'. For example, the repair pad 194 can overlap the terminal portion 132 of the first repair line 130' and the terminal portion 142 of the second repair line 140' In the initial situation, i.e. without being repaired, the repair pad 194 is electrically disconnected to at least one of the first repair line 130' and the second repair line 140'.

In some embodiments, the dimension D1 of the terminal portion 132 measured in X direction can be 10 micrometers (μm), the dimension D2 of the wiring portion 134 measured in X direction can be 7 μm and the dimension D3 of the terminal portion 132 measured in Y direction can be 7 μm. In some embodiments, the dimension D4 of the terminal portion 142 measured in X direction can be 10 μm, the dimension D5 of the wiring portion 144 measured in X direction can be 7 μm and the dimension D6 of the terminal portion 142 measured in Y direction can be 7 μm. In addition, the dimension D7 of the repair pad 194 measured in X direction can be 15 μm and the dimension D8 of the repair pad 194 measured in Y direction can be 20 μm. The above sizes are provided as examples for illustrating the size relationship of the components and the disclosure is not intended to limit to the above numbers. Specifically, the dimensions D1 to D8 can be varied based on different designs.

Figure 5:
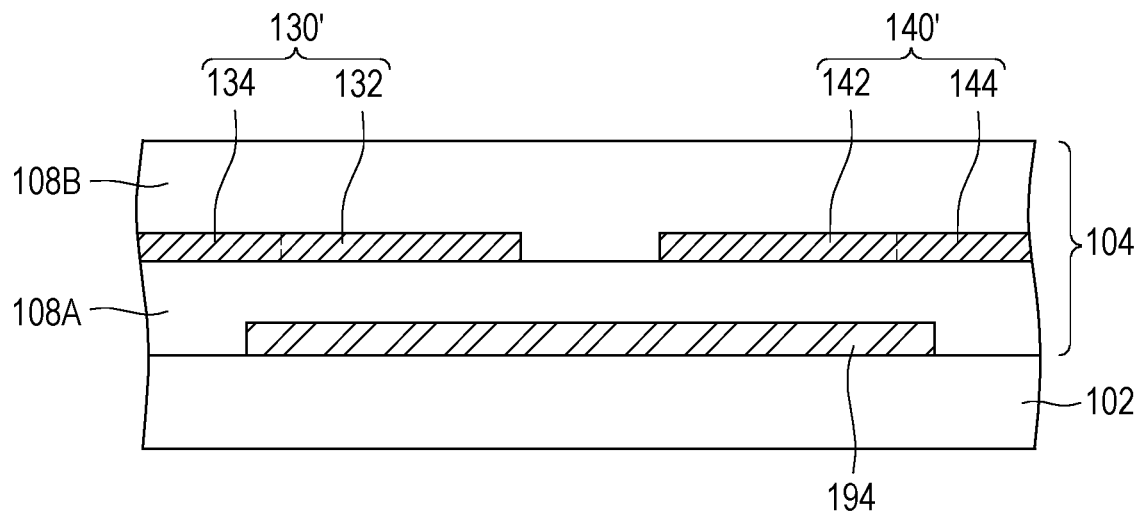
FIG. 5 schematically illustrates a cross section of a weldable region in accordance with some embodiments of the disclosure.

FIG. 5 schematically illustrates a cross section of a weldable region in accordance with some embodiments of the disclosure and the cross section of FIG. 5 is corresponding to the line II-II in FIG. 4. In FIG. 5, a substrate 102 is provided and a wiring structure 104 is disposed on the substrate 102. The substrate 102 and the wiring structure 104 can be incorporated to the substrate 102 and the wiring structure 104 of FIG. 3, but not limited thereto. As shown in FIG. 5, the wiring structure 104 disposed on the substrate 102 can include at least two conductive layers that are separated by at least one insulation layer such as the insulation layer 108A. Specifically, the repair pad 194 can be defined by one of the conductive layers in the wiring structure 104, and the first repair line 130' and the second repair line 140' can be defined by another of the conductive layers in the wiring structure 104. The conductive layer of the repair pad 194 can be disposed between the substrate 102 and the conductive layer of the first repair line 130' and the second repair line 140', but the disclosure is not limited thereto. In some embodiments, when incorporating the wiring structure 104 of FIG. 5 to the wiring structure 104 of FIG. 3, the conductive layer of the repair pad 194 is not shown in FIG. 3.

Figure 6:
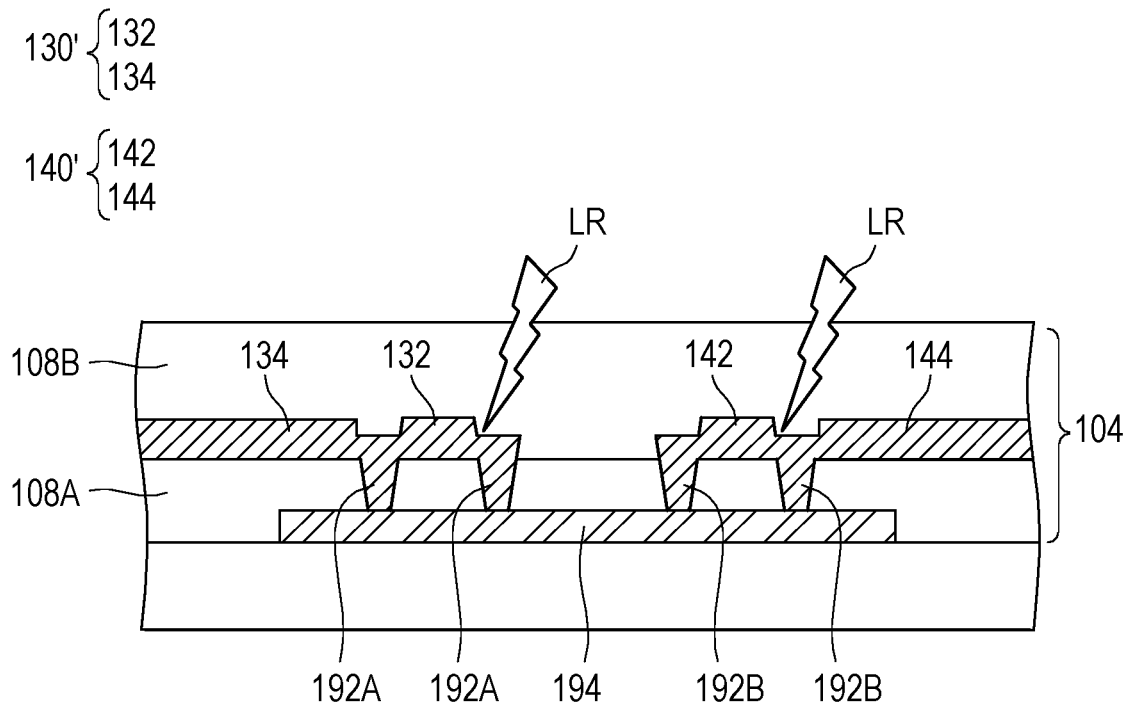
FIG. 6 schematically illustrates a cross section of a welded weldable region in accordance with some embodiments of the disclosure.

FIG. 6 schematically illustrates a cross section of a welded weldable region in accordance with some embodiments of the disclosure. The cross section of FIG. 6 shows that the structure of FIG. 5 is welded at the periphery of the terminal portion 132 of the first repair line 130' and the periphery of the terminal portion 142 of the second repair line 140'. In the embodiment, a high power radiation beam (for example a laser beam) LR can irradiate at the periphery of the terminal portion 132 of the first repair line 130' and the periphery of the terminal portion 142 of the second repair line 140' from a side of the repair pad 194 away from the substrate 102, and the material of the terminal portion 132 and the material of the terminal portion 142 can be melted to form a welded structure 192A and a welded structure 192B penetrating through the insulation layer 108A under the terminal portion 132 and the terminal portion 142.

The welded structure 192A can electrically connect the first repair line 130' to the repair pad 194 and the welded structure 192B can electrically connect the second repair line 140' to the repair pad 194. Through the welded structure 192A and the welded structure 192B, the first repair line 130' can be electrically connected to the second repair line 140' via the repair pad 194. The welded structure 192A, the welded structure 192B and the repair pad 194 shown in FIG. 6 can serve as an implemental example of the welded structure 192 in the first weldable region 190 in FIG. 2.

In other embodiments not shown in the drawings, the conductive layer of the first repair line 130' and the second repair line 140' can be disposed between the substrate 102 and the conductive layer of the repair pad 194, but the disclosure is not limited thereto. In the embodiment, the laser beam LR can irradiate at the periphery of the terminal portion 132 of the first repair line 130' and the periphery of the terminal portion 142 of the second repair line 140' from a side of the repair pad 194 adjacent to the substrate 102, but the disclosure is not limited thereto.

Figure 7:
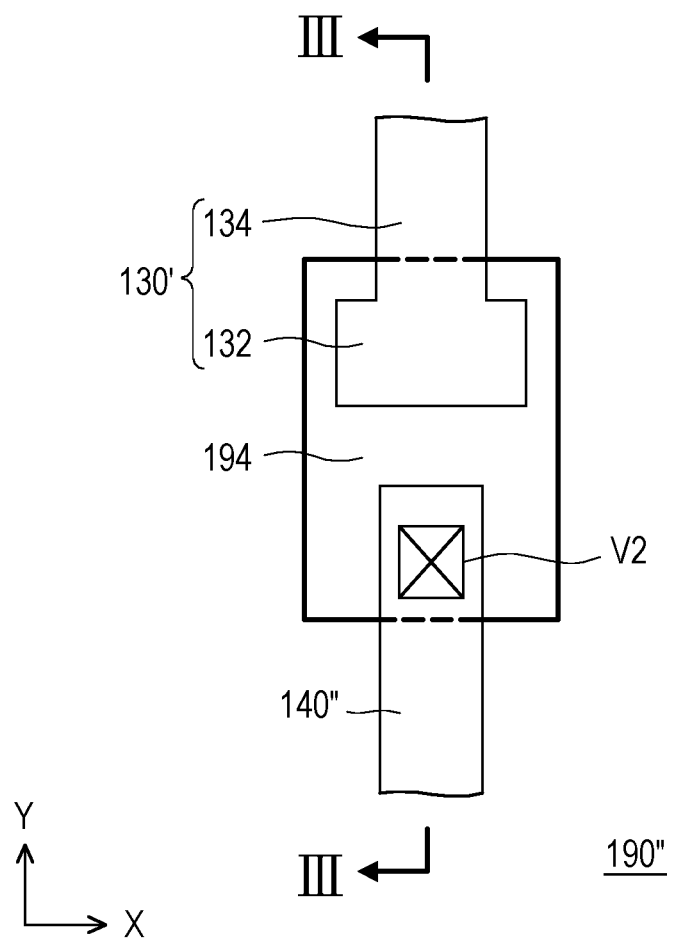
FIG. 7 schematically illustrates a weldable region in accordance with some embodiments of the disclosure.

FIG. 7 schematically illustrates a weldable region in accordance with some embodiments of the disclosure. A weldable region 190" shown in FIG. 7 is formed by the first repair line 130' and the second repair line 140". Specifically, the first repair line 130' includes a terminal portion 132 and a wiring portion 134 which may be narrower than the terminal portion 132 when measured in X direction, and the second repair line 140" has a substantial identical width when measured in X direction, but the disclosure is not limited thereto. The terminal portion 132 is more adjacent to the second repair line 140" than the wiring portion 134. Therefore, the first repair line 130' and the second repair line 140" are arranged in a manner that the terminal portion 132 faces the second repair line 140". In addition, the second repair line 140" can be electrically connected to the repair pad 194 in the initial situation.

Figure 8:
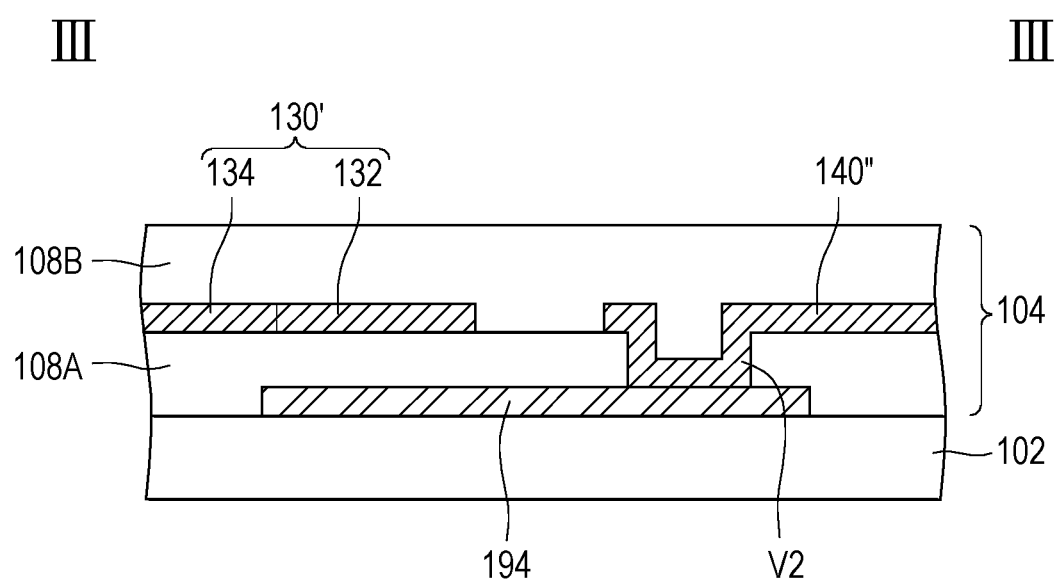
FIG. 8 schematically illustrates a cross section of a weldable region in accordance with some embodiments of the disclosure.

FIG. 8 schematically illustrates a cross section of a weldable region in accordance with some embodiments of the disclosure and the cross section of FIG. 8 is corresponding to the line III-III in FIG. 7. In FIG. 7, a substrate 102 is provided and a wiring structure 104 is disposed on the substrate 102. The substrate 102 and the wiring structure 104 can be incorporated to the substrate 102 and the wiring structure 104 of FIG. 3, but not limited thereto. As shown in FIG. 8, the wiring structure 104 can include at least two conductive layers that are separated by at least one insulation layer such as the insulation layer 108A. Specifically, the conductive layer of the repair pad 194 can be disposed between the substrate 102 and the conductive layer of the first repair line 130' and the second repair line 140", but the disclosure is not limited thereto. In addition, the second repair line 140" is electrically connected to the repair pad 194 through the conductive via V2 passing through the insulation layer 108A between the second repair line 140" and the repair pad 194. In the embodiment, a laser beam can irradiate at the periphery of the terminal portion 132 of the first repair line 130' from a side of the repair pad 194 away from the substrate 102 to electrically connect the first repair line 130' to the repair pad 194 when a repair process is required.

In other embodiments, the conductive layer of the first repair line 130' and the second repair line 140" may be disposed between the substrate 102 and the conductive layer of the repair pad 194. In addition, the conductive via V2 is formed between the second repair line 140" and the repair pad 194. In addition, a laser beam can irradiate the terminal portion 132 of the first repair line 130' from a side of the repair pad 194 adjacent to the substrate 102 to form the welded structure 192A when a repair process is required.

The weldable region 190' shown in FIGS. 4 to 6 and the weldable region 190" shown in FIGS. 7 to 8 are exemplary examples of the first weldable region 190 in FIGS. 1 and 2 and can be applicable to any embodiment of the disclosure. Specifically, the welded structure shown in FIG. 6 is applicable to the electronic device in the repaired situation, such as the electronic device 100A and the structure shown in FIGS. 5 and 8 are applicable to the electronic device in the initial situation, such as the electronic device 100.

Figure 9:
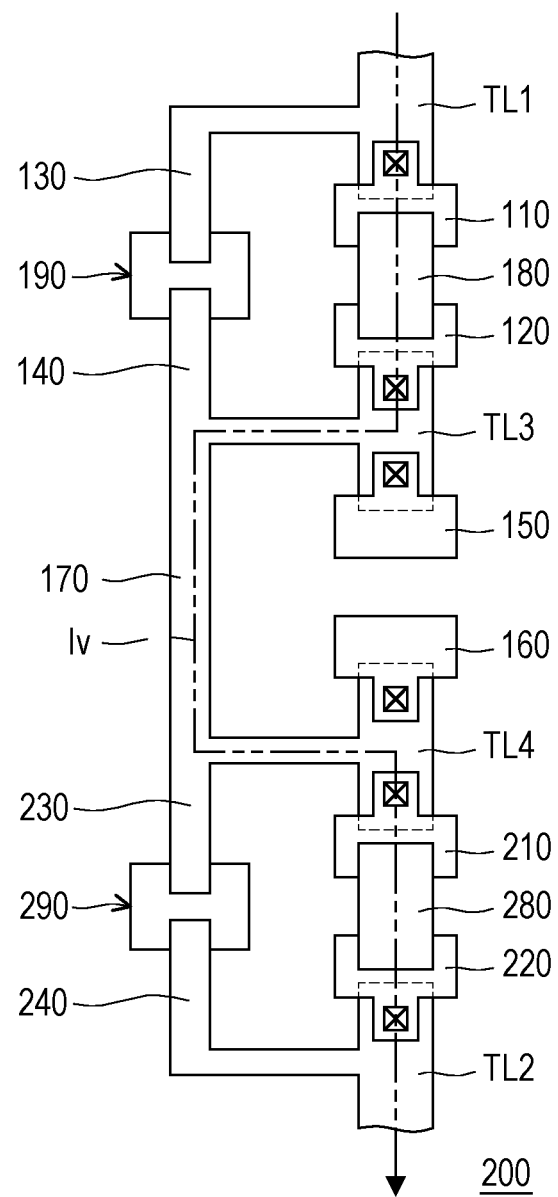
FIG. 9 schematically illustrates a portion of an electronic device in accordance with some embodiments of the disclosure.

FIG. 9 schematically illustrates a portion of an electronic device in accordance with some embodiments of the disclosure. The electronic device 200 in FIG. 9 includes the components the same as the embodiment of FIG. 1. The difference between the FIG. 1 and the FIG. 9 is that FIG. 9 further includes a third main pad 210; a fourth main pad 220; a third repair line 230 electrically connected to the connection line 170 and the third main pad 210; a fourth repair line 240 electrically connected to the fourth main pad 220 and a second electronic unit 280 disposed on the third main pad 210 and the fourth main pad 220. In the embodiment, the third repair line 230 and the fourth repair line 240 form a second weldable region 290.

In the embodiment, the connection relationships of the pair of the first main pad 110 and the second main pad 120 and the pair of the first repair line 130 and the second repair line 140 can refer to the descriptions of FIG. 1 and can be applicable to the connection relationships of the pair of the third main pad 210 and the fourth main pad 220 and the pair of the third repair line 230 and the fourth repair line 240. In addition, the connection line 170 is electrically connected to the second repair line 140, the second main pad 120, the first spare pad 150, the second spare pad 160, the third repair line 230 and the third main pad 210.

In the embodiment, the pair of the first main pad 110 and the second main pad 120, the connection line 170 and the pair of the third main pad 210 and the fourth main pad 220 establish an electric transmission path through the first transmission line TL1, the third transmission line TL3, the fourth transmission line TL4 and the second transmission line TL2. The first transmission line TL1 connects the first main pad 110 to a first voltage source (for example a power signal, not shown), the second transmission line TL2 connects the fourth main pad 220 to a second voltage source (for example a ground voltage, not shown), the third transmission line TL3 connects between the second main pad 120 and the first spare pad 150, and the fourth transmission line TL4 connects between the second spare pad 160 and the third main pad 210. In alternative embodiments, the third transmission line TL3, the second main pad 120 and the first spare pad 150 can be selectively integrated into a common pad. Similarly, the fourth transmission line TL4, the second spare pad 160, and the third main pad 210 can be selectively integrated into a common pad.

The arrangement of the pads is so designed that the first main pad 110 faces the second main pad 120, the first spare pad 150 faces the second spare pad 160, and the third pad 210 faces the fourth pad 220 and a corresponding electronic unit can be bonded to the pair of the first main pad 110 and the second main pad 120, the pair of the first spare pad 150 and the second spare pad 160, or the pair of the third main pad 210 and the fourth main pad 220. In an initial situation, the first main pad 110 and the second main pad 120 are electrically disconnected, the first spare pad 150 and the second spare pad 160 are electrically connected to each other, and the third main pad 210 and the fourth main pad 220 are electrically disconnected. The first electronic unit 180 can have two terminals respectively bonded to the first main pad 110 and the second main pad 120, the second electronic unit 280 can have two terminals respectively bonded to the third main pad 210 and the fourth main pad 220, and no electronic unit is bonded to the first spare pad 150 and the second spare pad 160. Therefore, the first electronic unit 180 and the second electronic unit 280 are electrically connected in series.

In the electronic device 200, the driving current Iv passes from the first transmission line TL1 to the second transmission line TL2 through the first main pad 110, the first electronic unit 180, the second main pad 120, the connection line 170, the third main pad 210, the second electronic unit 280, and the fourth main pad 220 in sequence, and the first electronic unit 180 and the second electronic unit 280 both emit light.

In the electronic device 200, the first weldable region 190 is similar to that described in FIG. 1 and the second weldable region 290 provides the same function as the first weldable region 190. Specifically, the first weldable region 190 and the second weldable region 290 can be implemented by any of the structures shown in FIG. 4, FIG. 5, FIG. 7, FIG. 8, or an alternative structure. As such, the electronic device 200 is repairable and can maintain the desired function through a repair process when one or both of the first electronic unit 180 and the second electronic unit 280 has a defect.

In alternative embodiments, the first electronic unit 180 has a short circuit defect and the second electronic unit 280 has a normal function for example can emit light. The short circuit defect of the first electronic unit 180 causes the electric connection of the first main pad 110 and the second main pad 120 and the voltage on the first transmission line TL1 can be applied to the first spare pad 150 through the first main pad 110, the first electronic unit 180, the second main pad 120 and the third transmission line TL3. In addition, the first electronic unit 180 in the electronic device 200 fails to emit light. For fixing the defect, a repair process is performed. The repair process can include placing a spare electronic unit (not shown) on the first spare pad 150 and the second spare pad 160, and cutting the connection line 170. In the embodiment, the connection line 170 is cut and the voltage on the first transmission line TL1 would not be applied directly to the second spare pad 160. Accordingly, two terminals of the spare electronic unit (not shown) respectively bonded to the first spare pad 150 and the second spare pad 160 and may receive independent electric signals which drive the spare electronic unit (not shown) to emit light.

In the repaired situation, the driving current Iv can pass from the first transmission line TL1 to the second transmission line TL2 through the first main pad 110, the first electronic unit 180, the second main pad 120, the third transmission line TL3, the first spare pad 150, the spare electronic unit (not shown), the second spare pad 160, the fourth transmission line TL4, the third main pad 210, the second electronic unit 280, and the fourth main pad 220 in sequence. As such, the spare electronic unit (not shown) and the second electronic unit 280 can emit light under the driving current Iv though the first electronic unit 180 has a short circuit defect and fails to emit light.

In alternative embodiments, the first electronic unit 180 is found to have an open circuit defect, and the second electronic unit 280 has a normal function for example can emit light. The open circuit defect of the first electronic unit 180 breaks the electric transmission path between the first main pad 110 and the second main pad 120 through the first electronic unit 180 and the first repair line 130 and the second repair line 140 are electrically connected through the first weldable region 190. A repair process is performed by providing the electronic device 200, placing a spare electronic unit (not shown) on the first spare pad 150 and the second spare pad 160, cutting the connection line 170 and welding the first weldable region 190, and an electric transmission path is established from the first transmission line TL1 to the first spare pad 150 through the first repair line 130, the first weldable region 190 and the second repair line 140. The connection line 170 is cut and the first spare pad 150 and the second spare pad 160 are electrically disconnected and the spare electronic unit (not shown) disposed on the first spare pad 150 and the second spare pad 160 can emit light upon receiving the electric signals from the first spare pad 150 and the second spare pad 160. Specifically, the driving current Iv can pass from the first transmission line TL1 to the second transmission line TL2 through the first repair line 130, the first weldable region 190, the second repair line 140, the third transmission line TL3, the first spare pad 150, the spare electronic unit (not shown), the second spare pad 160, the fourth transmission line TL4, the third main pad 210, the second electronic unit 280, and the fourth main pad 220 in sequence. The spare electronic unit (not shown) and the second electronic unit 280 can emit light under the driving current Iv though the first electronic unit 180 has an open circuit defect and fails to emit light.

In alternative embodiments, the second electronic unit 280 has a short circuit defect and a repair process is performed on the electronic device 200 shown in FIG. 9. The repair process is similar to the repair process in which the electronic unit 180 has a short circuit defect, and will not be repeated again.

In alternative embodiments, the second electronic unit 280 has an open circuit defect and a repair process is performed on the electronic device 200 in FIG. 9. The repair process is similar to the repair process in which the electronic unit 180 has a open circuit defect, and will not be repeated again.

In alternative embodiments, the first electronic unit 180 and the second electronic unit 280 both have short circuit defects and the electronic device 200 is repaired by placing a spare electronic unit (not shown) on the first spare pad 150 and the second spare pad 160, and cutting the connection line 170. As such, the driving current Iv can pass from the first transmission line TL1 to the second transmission line TL2 through the first main pad 110, the first electronic unit 180, the second main pad 120, the third transmission line TL3, the first spare pad 150, the spare electronic unit (not shown), the second spare pad 160, the fourth transmission line TL4, the third main pad 210, the second electronic unit 280 and the fourth main pad 220 in sequence to drive the spare electronic unit (not shown) to emit light. In other words, the electronic device 200 includes three electronic units but only one electronic unit, the spare electronic unit (not shown), can emit light. In some embodiments, the value of the driving current Iv can be adjusted for achieving the required light emitting effect. For example, to achieve similar or identical light emitting effect to the electronic device 200, a modified driving current Iv generated in repaired the electronic device 200 can be twice as the driving current Iv generated in the initial electronic device 200 since the number of the acceptable electronic unit in the initial electronic device 200 is twice of that in the repaired electronic device, but the disclosure is not limited thereto.

In alternative embodiments, the first electronic unit 180 has a short circuit defect, the second electronic unit 280 has an open circuit defect, and the electronic device 200 can be repaired by placing a spare electronic unit (not shown) on the first spare pad 150 and the second spare pad 160, cutting the connection line 170, and welding the second weldable region 290 to electrically connect the third repair line 230 and the fourth repair line 240. As such, the driving current Iv can pass from the first transmission line TL1 to the second transmission line TL2 through the first main pad 110, the first electronic unit 180, the second main pad 120, the third transmission line TL3, the first spare pad 150, the spare electronic unit (not shown), the second spare pad 160, the fourth transmission line TL4, the third repair line 230, the second weldable region 290 and the fourth repair line 240 in sequence to drive the spare electronic unit (not shown) to emit light. In other words, the repaired electronic device 200 includes three electronic units but only one electronic unit, the spare electronic unit (not shown) can emit light. In some embodiments, the value of the driving current Iv in the repaired electronic device 200 can be adjusted for achieving the required light emitting effect.

In alternative embodiments, the first electronic unit 180 has an open circuit defect, the second electronic unit 280 has a short circuit defect, and the electronic device 200 is repaired by providing the electronic device 200 in FIG. 9, placing a spare electronic unit (not shown) on the first spare pad 150 and the second spare pad 160, cutting the connection line 170, and welding the first weldable region 190 to electrically connect the first repair line 130 and the second repair line 140. In the repaired situation, the driving current Iv can pass from the first transmission line TL1 to the second transmission line TL2 through the first repair line 130, the first weldable region 190, the second repair line 140, the first spare pad 150, the spare electronic unit (not shown), the second spare pad 160, the fourth transmission line TL4, the third main pad 210, the second electronic unit 280 and the fourth main pad 220 in sequence to drive the spare electronic unit (not shown) to emit light. In other words, the repaired electronic device 200 includes three electronic units but only one electronic unit, the spare electronic unit (not shown) can emit light. In some embodiments, the value of the driving current Iv can be adjusted for achieving the required light emitting effect.

In alternative embodiments, the first electronic unit 180 and the second electronic unit 280 both have open circuit defects, and the electronic device 200 is repaired by providing the electronic device 200 in FIG. 9, placing a spare electronic unit (not shown) on the first spare pad 150 and the second spare pad 160, cutting the connection line 170, welding the first weldable region 190 to electrically connect the first repair line 130 and the second repair line 140, and welding the second weldable region 290 to electrically connect the third repair line 230 and the fourth repair line 240. In the repaired electronic device 200, the driving current Iv can pass from the first transmission line TL1 to the second transmission line TL2 through the first repair line 130, the first weldable region 190, the second repair line 140, the first spare pad 150, the spare electronic unit (not shown), the second spare pad 160, the fourth transmission line TL4, the third repair line 230, the second weldable region 290 and the fourth repair line 240 in sequence to drive the spare electronic unit (not shown) to emit light. In other words, the repaired electronic device 200 includes three electronic units but only one electronic unit, the spare electronic unit (not shown) can emit light. In some embodiments, the value of the driving current Iv can be adjusted for achieving the required light emitting effect.

In the above embodiments, the welded structure formed in the first weldable region 190 or in the second weldable region 290 can be implemented by the structure shown in FIG. 6, or other alternative structures. In addition, the structures of the first main pad 110, the second main pad 120, the first spare pad 150, the second spare pad 160, the third main pad 210 and the fourth main pad 220 can be implemented by the structure shown in FIG. 3.

Figure 10:
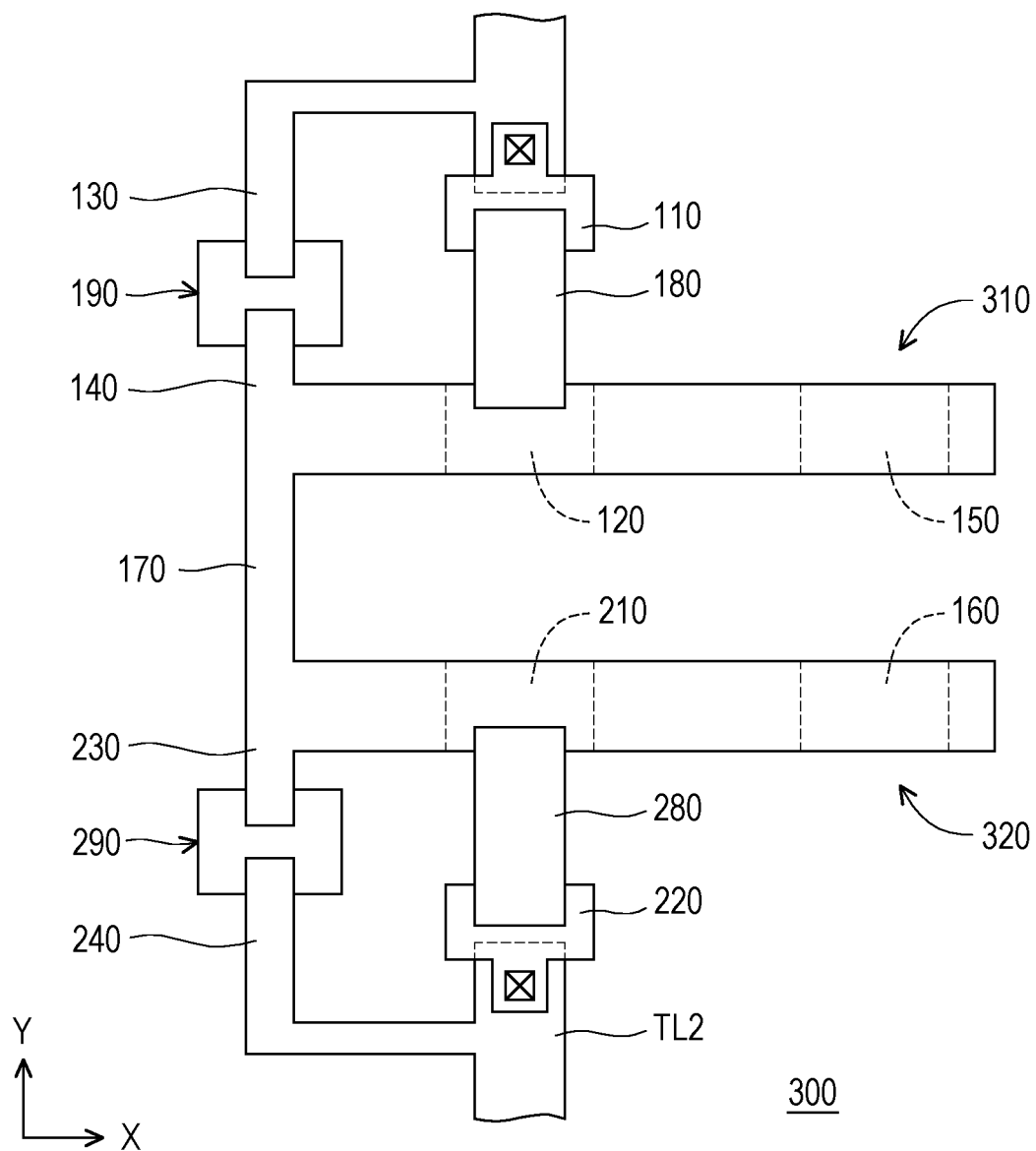
FIG. 10 schematically illustrates a portion of an electronic device in accordance with some embodiments of the disclosure.

FIG. 10 schematically illustrates a portion of an electronic device in accordance with some embodiments. In FIG. 10, an electronic device 300 is similar to the electronic device 200 and includes a first main pad 110; a second main pad 120; a first repair line 130 electrically connected to the first main pad 110; a second repair line 140 electrically connected to the second main pad 120, a first spare pad 150; a second spare pad 160; a connection line 170 electrically connected to the second repair line 140; a first electronic unit 180 disposed on the first main pad 110 and the second main pad 120; a third main pad 210; a fourth main pad 220; a third repair line 230 electrically connected to the connection line 170, the third main pad 210 and the second spare pad 160; a fourth repair line 240 electrically connected to the fourth main pad 220 and a second electronic unit 280 disposed on the third main pad 210 and the fourth main pad 220. A first weldable region 190 is formed between the first repair line 130 and the second repair line 140 and a second weldable 290 is formed between the third repair line 230 and the fourth repair line 240. In addition, a difference from the light emitting deice 200 is that in the electronic device 300, the second main pad 120 and the first spare pad 150 are integrated in a common pad 310 and the third pad 210 and the second spare pad 160 are integrated in a common pad 320. Namely, the second main pad 120 and the first spare pad 150 are defined by respective portions of the common pad 310 without a physical boundary between the second main pad 220 and the first spare pad 150. Similarly, the third main pad 210 and the second spare pad 160 are defined by respective portions of the common pad 320 without a physical boundary between the third main pad 210 and the second spare pad 160.

In the embodiment, an area of the common pad 310 and an area of the common pad 320 are greater than the first main pad 110 and also greater than the fourth main pad 220. For example, as shown in FIG. 10, in Y direction, the common pad 310 and/or the common pad 320 can have a dimension substantially similar to the first main pad 110 and/or the fourth main pad 220, but in X direction, the common pad 310 and/or the common pad 320 have a dimension greater than the first main pad 110 and/or the fourth main pad 220. The second main pad 120 and the first spare pad 150 are arranged side-by-side in X direction and similarly, the second spare pad 160 and the third main pad 210 are arranged side-by-side in X direction. In the embodiment, the transmission lines TL3 and TL4 shown in FIG. 9 can be omitted. In some other embodiments, the common pad 310 and/or the common pad 320 can have an elongated dimension in Y direction and the second main pad 120 and the first spare pad 150 are arranged side-by-side in Y direction and similarly, the second spare pad 160 and the third main pad 210 are arranged side-by-side in Y direction.

In the case that the first electronic unit 180 and/or the second electronic unit 280 have a defect, a repair process can be performed. Specifically, the details of the repair process and the repaired structure can refer to the description of any of FIGS. 2 to 9. Therefore, the electronic device 300 can work normally even though the first electronic unit 180 and/or the second electronic unit 280 has a defect, which achieves an improved yield rate.

In light of the above, the electronic device in accordance with the embodiments of the disclosure include at least a pair of main pads, a pair of spare pads, a pair of repair lines and a connection line. The pair of main pads is connected to the pair of the repair line in a manner of one main pad connects to one repair line and the pair of repair lines are arranged facing each other to form a weldable region. In addition, the connection line connects the pair of the spare pads and one repair line of the pair of repair lines. In the case that the electronic unit disposed on the main pads has a defect, the connection line can be cut, a spare electronic unit is disposed on the spare pads and the weldable region is selectively welded to generate the electric transmission path of the driving current that drives the spare electronic unit to maintain the desired function. Therefore, the spare electronic unit disposed on the pair of spare pads can replace the electronic unit disposed on the pair of main pads to maintain the desired function of the electronic device. In some embodiments, the electronic device can include multiple pairs of main pads and the multiple pairs of main pads can share at least one pair of spare pads. For example, two pairs of the main pads can share one pair of spare pads and the pair of the spare pad can be connected between the two pair of the main pads. Alternately, three or more pairs of the main pads can share one pair of spare pads and the pair of the spare pad can be connected between two of the three pair of the main pads. In some embodiments, the number of the pair of the main pads can be the same as the number of the pair of the spare pads. In addition, the weldable region and the pair of repair lines can be designed corresponding to the number of the pair of the main pad such that each main pad is connected to one repair line and each pair of main pads is collaborated with one weldable region. Accordingly, the electronic device in accordance with the embodiments in the disclosure is repairable and has desirable yield rate.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
a first main pad;
a second main pad;
a first repair line electrically connected to the first main pad;
a second repair line electrically connected to the second main pad, wherein the first repair line and the second repair line forms a first weldable region;
a first spare pad;
a second spare pad;
a connection line electrically connected to the second repair line, the first spare pad and the second spare pad; and
a first electronic unit disposed on the first main pad and the second main pad.

2. The electronic device of claim 1, wherein the second main pad and the first spare pad are integrated in a common pad.

3. The electronic device of claim 2, wherein an area of the common pad is greater than the first main pad and greater than the second spare pad.

4. The electronic device of claim 1, further comprising a spare electronic unit disposed on the first spare pad and the second spare pad, wherein the first electronic unit has an open circuit defect, the first weldable region is welded to electrically connect the first repair line to the second repair line, and the connection line is cut.

5. The electronic device of claim 1, further comprising:
a third main pad;
a fourth main pad;
a third repair line electrically connected to the connection line and the third main pad;
a fourth repair line electrically connected to the fourth main pad, wherein the third repair line and the fourth repair line form a second weldable region; and
a second electronic unit disposed on the third main pad and the fourth main pad.

6. The electronic device of claim 5, wherein the second main pad and the first spare pad are integrated in a common pad.

7. The electronic device of claim 5, further comprising a spare electronic unit disposed on the first spare pad and the second spare pad, wherein the first electronic unit and the second electronic unit have short circuit defects and the connection ling is cut.

8. The electronic device of claim 5, further comprising a spare electronic unit disposed on the first spare pad and the second spare pad, wherein the first electronic unit has an open circuit defect, the second electronic has a short circuit defect, the connection line is cut and the first weldable region is welded.

9. The electronic device of claim 5, further comprising a spare electronic unit disposed on the first spare pad and the second spare pad, wherein the first electronic unit has a short circuit defect, the second electronic unit has a normal function, and the connection line is cut.

10. The electronic device of claim 5, further comprising a spare electronic unit disposed on the first spare pad and the second spare pad, wherein the first electronic unit has an open circuit defect, the second electronic unit has a normal function, the connection line is cut and the first weldable region is welded.

11. The electronic device of claim 5, further comprising a spare electronic unit disposed on the first spare pad and the second spare pad, wherein the first electronic unit and the second electronic unit have open circuit defects, the connection line is cut, the first weldable region is welded, and the second weldable region is welded.

12. A method of fabricating an electronic device, comprising:
providing a substrate;
forming a wiring structure on the substrate, the wiring structure comprising a first repair line, a second repair line and a connection line, wherein the first repair line and the second repair line form a first weldable region;
forming a bonding layer on the wiring structure, the bonding layer comprising a first main pad, a second main pad, a first spare pad, and a second spare pad, wherein the first repair line is electrically connected to the first main pad, the second repair line is electrically connected to the second main pad, and the connection line is electrically connected to the second repair line, the first spare pad and the second spare pad; and
placing a first electronic unit on the first main pad and the second main pad.

13. The method of claim 12, further placing a spare electronic unit on the first spare pad and the second spare pad, welding the first weldable region to electrically connect the first repair line to the second repair line and cutting the connection line, wherein the first electronic unit has an open circuit defect.

14. The method of claim 12, further placing a spare electronic unit on the first spare pad and the second spare pad, and cutting the connection line, wherein the first electronic unit has a short circuit defect.

15. The method of claim 12, wherein the wiring structure further comprises a third repair line and a fourth repair line, the bonding layer further comprises a third main pad and a fourth main pad, the third repair line is electrically connected to the connection line and the third main pad, the fourth repair line is electrically connected to the fourth main pad, and the third repair line and the fourth repair line forms a second weldable region, and wherein the method further comprises placing a second electronic unit on the third main pad and the fourth main pad.

16. The method of claim 15, further placing a spare electronic unit on the first spare pad and the second spare pad, and cutting the connection line, wherein the first electronic unit and the second electronic unit have short circuit defects.

17. The method of claim 15, further placing a spare electronic unit on the first spare pad and the second spare pad, cutting the connection line and welding the first weldable region, wherein the first electronic unit has an open circuit defect and the second electronic unit has a short circuit defect.

18. The method of claim 15, further placing a spare electronic unit on the first spare pad and the second spare pad and cutting the connection line, wherein the first electronic unit has a short circuit defect and the second electronic unit has a normal function.

19. The method of claim 15, further placing a spare electronic unit on the first spare pad and the second spare pad, cutting the connection line and welding the first weldable region, wherein the first electronic unit has an open circuit defect and the second electronic unit has a normal function.

20. The method of claim 15, further placing a spare electronic unit on the first spare pad and the second spare pad, cutting the connection line, welding the first weldable region and welding the second weldable region, wherein the first electronic unit and the second electronic unit have open circuit defects.

* * * * *